(12) United States Patent
Tang et al.

(10) Patent No.: US 8,119,220 B2
(45) Date of Patent: Feb. 21, 2012

(54) COMPOSITE MATERIAL, ESPECIALLY MULTILAYER MATERIAL, AND ADHESIVE OR BONDING MATERIAL

(75) Inventors: Xinhe Tang, Vienna (AT); Ka Chun Tse, Hong Kong (CN); Ernst Hammel, Vienna (AT); Ben Zhong Tang, Hong Kong (CN)

(73) Assignee: Curamik Electronics GmbH, Eschenbach (DE)

( * ) Notice: Subject to any disclaimer, the term of this patent is extended or adjusted under 35 U.S.C. 154(b) by 741 days.

(21) Appl. No.: 12/086,983

(22) PCT Filed: Aug. 10, 2006

(86) PCT No.: PCT/IB2006/003030
§ 371 (c)(1),
(2), (4) Date: Jun. 23, 2008

(87) PCT Pub. No.: WO2007/072126
PCT Pub. Date: Jun. 28, 2007

(65) Prior Publication Data
US 2010/0227114 A1    Sep. 9, 2010

(30) Foreign Application Priority Data
Dec. 23, 2005    (DE) .................. 10 2005 062 181

(51) Int. Cl.
*B32B 5/12*    (2006.01)
*B32B 27/38*    (2006.01)
*C08L 63/00*    (2006.01)
*C08L 67/00*    (2006.01)
*H01F 1/42*    (2006.01)

(52) U.S. Cl. ........ 428/114; 428/98; 428/105; 428/298.1

(58) Field of Classification Search .................. 428/114, 428/98, 105, 298.1
See application file for complete search history.

(56) References Cited

U.S. PATENT DOCUMENTS

| | | |
|---|---|---|
| 5,458,967 A | 10/1995 | Kanno et al. |
| 6,103,812 A | 8/2000 | Wei et al. |
| 6,265,466 B1 | 7/2001 | Glatkowski |
| 2004/0245910 A1* | 12/2004 | Tang et al. .................. 313/483 |
| 2005/0017012 A1 | 1/2005 | Hodge |
| 2005/0119371 A1 | 6/2005 | Drzal et al. |
| 2006/0025515 A1* | 2/2006 | Scaringe et al. .............. 524/496 |
| 2006/0081819 A1 | 4/2006 | Li et al. |
| 2006/0113511 A1 | 6/2006 | Chen |

FOREIGN PATENT DOCUMENTS

| | | |
|---|---|---|
| DE | 10224185 | 12/2002 |
| EP | 1 457 509 A1 | 9/2004 |

(Continued)

OTHER PUBLICATIONS

XP-002425968, Derwent.
XP-002425968, May 26, 2005, Derwent.

*Primary Examiner* — Brent O'Hern
(74) *Attorney, Agent, or Firm* — Welsh Flaxman & Gitler LLC

(57) ABSTRACT

Disclosed is a multilayer material in which at least two components are jointed to each other via an adhesive bond. The adhesive bond is formed by an adhesive or bonding layer containing nanofiber material in a matrix that is suitable as an adhesive.

14 Claims, 2 Drawing Sheets

FOREIGN PATENT DOCUMENTS

| | | |
|---|---|---|
| JP | 2002146672 | 5/2002 |
| JP | 2005-389802 | 5/2005 |
| JP | 2005159225 | 6/2005 |
| WO | WO 01/72919 | 10/2001 |
| WO | WO 2005/028174 | 3/2005 |
| WO | WO2006030945 | 3/2006 |

* cited by examiner

COMPOSITE MATERIAL, ESPECIALLY MULTILAYER MATERIAL, AND ADHESIVE OR BONDING MATERIAL

BACKGROUND OF THE INVENTION

The invention relates to a composite material according to the preamble of claim 1 and in particular to a composite material consisting of a ceramic layer and of at least one metallization or metal layer provided on said ceramic layer. The invention further relates to an adhesive or bond material.

The manufacture of composite materials, also as printed circuit boards in the form of metal-ceramic substrates based on DCB technology is known in the art. In this process, the metallization required for the manufacture of strip conductors, connections, etc. is applied on a ceramic, for example on an aluminum-oxide ceramic, using direct copper bonding technology, the metallization being formed by metal or copper foils or metal or copper sheets, comprising on the top side a layer or coating (melt layer) from a chemical bond with the metal and a reactive gas, preferably oxygen.

In this method, which is described for example in U.S. Pat. No. 3,744,120 and in DE-PS 23 19 854, this layer or coating (hot-melt layer) forms a eutectic with a melting temperature below the melting temperature of the metal (e.g. copper), so that the layers can be bonded to each other by placing the foil on the ceramic and heating all layers, namely by melting the metal or copper essentially only in the area of the hot-melt layer or oxide layer.

This DCB method then comprises the following steps:
- oxidation of a copper foil so as to produce an even copper oxide layer;
- placing of the copper foil on the ceramic layer;
- heating the composite to a process temperature between approx. 1025 and 1083° C., e.g. to approx. 1071° C.;
- cooling to room temperature.

Also known is the so-called active soldering method (DE 22 13 115; EP-A-153 618) for bonding metal layers or metal foils forming metallizations, in particular also of copper layers or copper foils, with the respective ceramic material. In this process, which is used especially for manufacturing a metal-ceramic substrate, a bond is produced at a temperature of ca. 800-1000° C. between a metal foil, for example copper foil, and a ceramic substrate, for example aluminum-nitride ceramic, using a hard solder, which in addition to a main component such as copper, silver and/or gold also contains an active metal. This active metal, which is at least one element of the group Hf, Ti, Zr, Nb, Ce, creates a bond between the solder and the ceramic through a chemical reaction, while the bond between the solder and the metal is a metallic hard solder bond.

It is an object of the present invention is to provide a composite material that can be manufactured in an especially simple and economical manner, while maintaining optimum thermal properties.

SUMMARY OF THE INVENTION

The composite material according to the invention is preferably a multi-layer material, and preferably a multi-layer material that is suitable for electric circuits, modules, etc. made up of a lamellar carrier or substrate with at least one surface side of an electrically insulating material and of at least one metallization formed by a metal or copper plate or metal or copper foil that is bonded with the substrate by means of the composite material.

The advantage of the composite material according to the invention is that it can be manufactured easily and economically. Further, the layer formed by the adhesive or bonding agent compensates different temperature expansion coefficients of the materials of the metallization and of the substrate. A compensating effect for the thermal expansion of the metallization can be achieved especially in the case of corresponding orientation of at least one part of the nanofiber material in the bond layer parallel or approximately parallel to the bonded surfaces.

BRIEF DESCRIPTION OF THE DRAWINGS

The invention is explained below in more detail based on an exemplary embodiment with reference to the drawings, wherein.

DETAILED DESCRIPTION OF THE INVENTION

Figure 1:
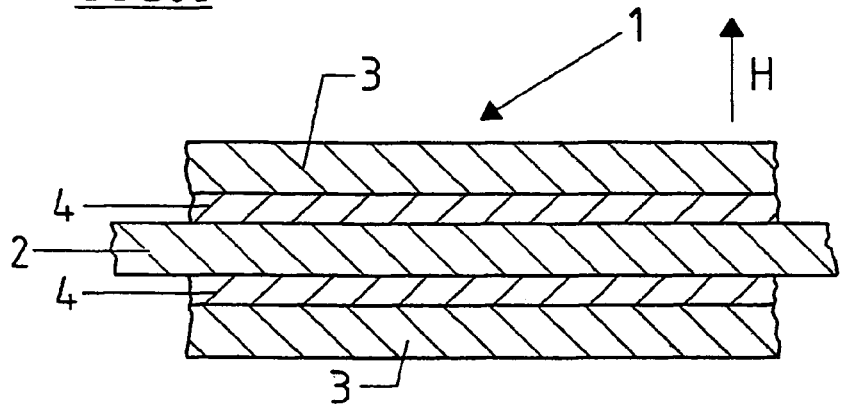
FIGS. 1 and 2 each show a simplified representation of a cross section of a multi-layer material according to the invention.

In FIG. 1, a multi-layer material generally designated 1 is suitable, for example, as a printed circuit board for electric circuits or modules. The multi-layer material has a lamellar carrier or substrate 2, which in this embodiment is manufactured altogether from an electrically insulating material, e.g. from a ceramic, for example aluminum-oxide ceramic, aluminum-nitride ceramic, silicon-nitride ceramic, etc. Other materials for the substrate 2 are also conceivable, for example plastic, e.g. with an epoxy base, etc.

A metallization 3, formed from a thin metal plate or foil, for example from a copper plate or copper foil, is provided two-dimensionally on a surface side of the substrate 2. This metallization 3 is bonded two-dimensionally with the substrate 2 by means of an adhesive or bond layer 4 formed by an adhesive or a bonding material. In the depicted embodiment, the substrate 2 is provided on both surface sides with the metallization 3. The bond material or multi-layer material 1 is therefore symmetrical in relation to a middle plane of the substrate 2, at least with respect to the type and sequence of the individual layers. Fundamentally, it is also possible to provide the metallization 3 on only one surface side of the substrate 2. To manufacture the strip conductors, contact surfaces, etc., at least the metallization 3 on a side of the substrate 2 is patterned accordingly using the usual etching and masking technology known in the art.

Figure 2:
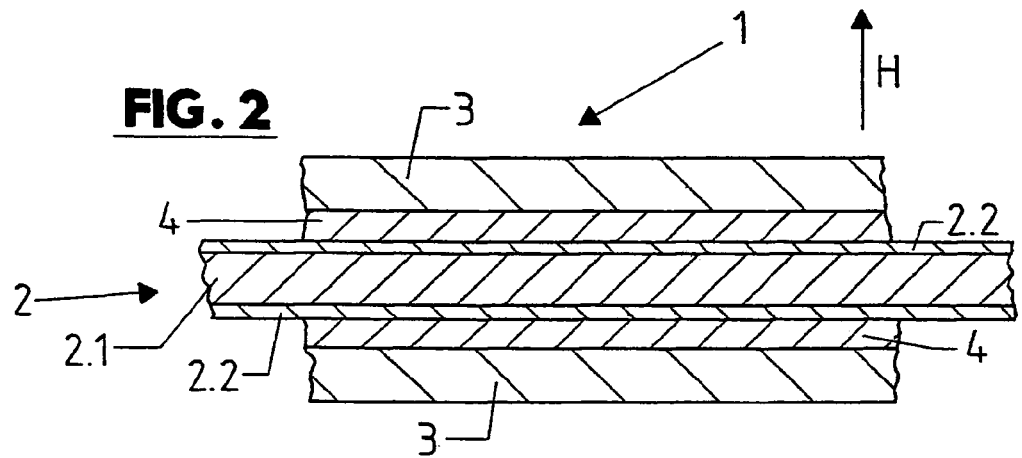

As depicted in FIG. 2, it is further possible to design the substrate 2 in multiple layers, namely consisting of a metallic support layer 2.1, for example of aluminum, and an insulating layer 2.2 on the surface sides of the lamellar substrate 2, namely where a bond layer 4 adjoins a metallization 3.

A special characteristic of the multi-layer product 1 is that the bond layer 4 contains carbon nanofiber material or carbon nanofibers or nanotubes in an epoxide resin matrix, resulting in an extremely low thermal resistance RtH (° K/W) or conversely a high thermal conductivity 1/Rth for the bond layer, i.e. a multi-layer material 1 with a substrate 2 made of an aluminum-oxide ceramic is by all means comparable in terms of the thermal conductivity and the thermal resistance between the upper and lower metallization 3 with a multi-layer material in which the metallizations are applied to the ceramic substrate using DCB technology, as explained in more detail below. The matrix contains approximately 5 to 30 percent by weight nanofiber material relative to the total weight of the adhesive or bond material.

In a preferred embodiment a carbon nanofiber available commercially as "Pyrograf III" is used as the nanofiber material. This material is heated at a temperature of 3000° C. before being mixed into the matrix, and also before any pre-treatment. A matrix with an epoxy base, for example polyester, is used for the matrix. To achieve optimum binding of the nanofiber material in the matrix material, a solvent is used; especially suitable for this purpose is triethylene glycol monobutylether.

Figure 3:
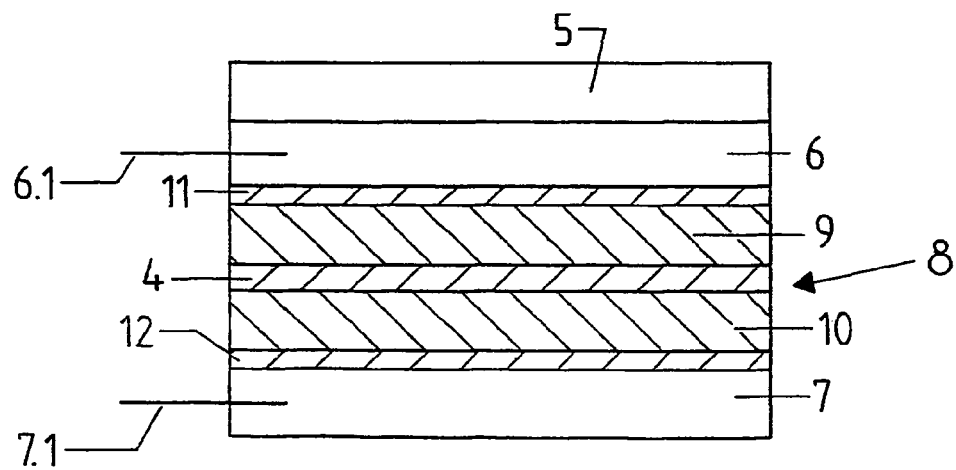
FIG. 3 is a schematic representation of a measuring array for determining the thermal behavior of a thermal compound embodied as an adhesive or of a thermal adhesive according to the invention.

FIG. 3 shows in a schematic representation an array for measuring the thermal resistance caused by the bond layer 4. The array is made up of an upper heating plate 5, a measuring plate 6 adjoining said heating plate and optimally connected to the same for heat transfer and of a lower measuring plate 7. The measuring plates 6 and 7 are provided with temperature gauges or sensors 6.1 and 7.2, which are used to measure the exact temperature of said plates and to send the measured values to measuring or analysis electronics. The heating plate 5 is operated electrically, namely for example with a heating voltage of 60 volts and with a constant heating current of 2.7 amperes, for example, so that a precisely defined, constant heat quantity is generated by the heat plate 5 during the measuring process.

The respective test piece 8, which is made up of two copper plates 9 and 10, which are connected with each other via the hardened bond layer 4, is located between the two measuring plates 6 and 7. To achieve a lossless transfer of heat between the test piece 8 and the measuring plates 6 and 7, a layer 11 and 12 made of a conventional thermal compound with known properties is provided respectively between the measuring plates 6 and 7 and the adjacent plates 9 and 10.

The thermal resistance Rth is defined as follows:

$Rth(° K/W) = (T1-T2)/$output of the heater 5 in W; the thermal conductivity is then $1/Rth$.

Figures 4, 5, 6:
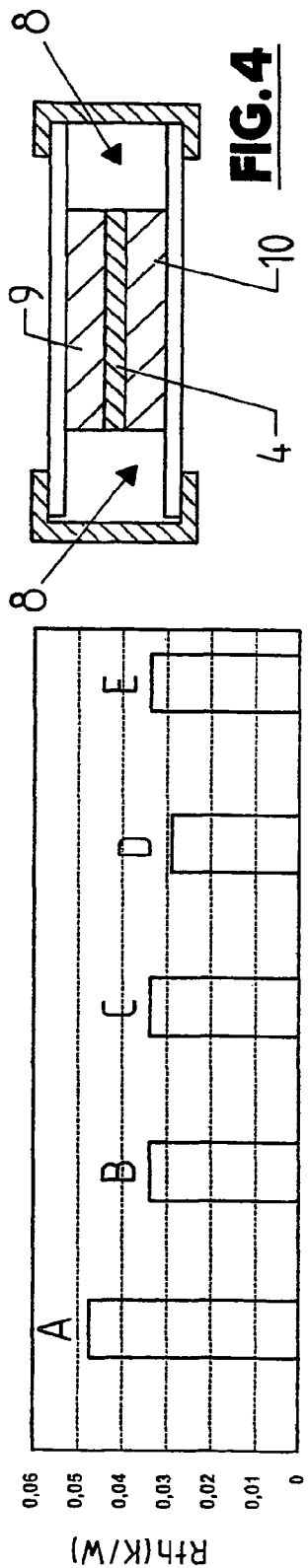
FIG. 4 is a schematic representation of an array for preparation of various test pieces.
FIG. 5 shows the thermal resistance, measured for various test pieces.
FIG. 6 shows a comparison of the thermal resistance measured in the case of the device in FIG. 3 with different material bonds or multi-layer materials.

FIG. 5 is a graph showing the thermal resistance Rth in ° K/W measured for various test pieces, namely:
Position A: with stacked plates 9 and 10 that are not bonded by the bond layer 4;
Position B-E: each with plates 9 and 10 that are bonded by the bond layer 4, however;
  Position B: without further temperature treatment;
  Position C: with treatment of test piece 8 for 2.8 days at a temperature of 120° C.;
  Position D: with treatment of test piece 8 for 6 days at a temperature of 120° C.;
  Position E: with treatment of test piece 8 for 1 day at a temperature of 160° C.

FIG. 5 shows that the thermal conductivity of the bond layer 4 improves with longer temperature exposure, apparently due to further hardening of this layer. The measurements also show that the thermal resistance Rth measured at the respective test piece 8 decreases slightly only initially, i.e. in an initial phase of each measurement, apparently due to the sluggishness of the measuring system, and then remains constant after this initial phase.

FIG. 6 shows by way of comparison the thermal resistance of a copper-ceramic multi-layer material. For this measurement, instead of the test pieces 8 with the two copper plates 9 and 10, test pieces were used in which the lower copper plate 10 was replaced with a ceramic plate or a ceramic substrate of the same size. Position A in FIG. 6 shows the thermal resistance Rth (° K/W) of a test piece in which the upper plate 9 made of copper bears against the lower plate 10 made of ceramic (aluminum-oxide ceramic) without a bond. Positions B and D refer to measurements in which the upper plate 9 made of copper is bonded with the lower plate 10 made of ceramic by means of the bond layer 4, namely
Position B: with treatment of test piece 8 for 3 days at a temperature of 150° C. and
Position D: without further treatment of the test piece 8.

Position C shows by way of comparison the thermal resistance of a DCB substrate. Position E is the thermal resistance measured with the measuring device of FIG. 3 without the test piece 8, i.e. with measuring plates 6 and 7 bearing against each other directly via the layers 11 and 12.

It goes without saying that plates 9 and 10 of the same size were used for all measurements.

The thermal conductivity of the bond layer 4 can be significantly increased by the use of nanofibers made of the nanofiber material that have an optimum length, i.e. these fibers or at least the majority of these fibers have a length between 1 and 100μ, preferably 10μ, and/or by pre-treatment of the nanofiber material and optimum binding of the nanofiber material in the matrix forming the bond material as a result of this pre-treatment. This length corresponds to the surface unevenness that normally exists with ceramic substrates and/or copper foils, so that this unevenness can be optimally compensated with nanofibers of this length.

A further improvement of the thermal conductivity of the bond layers 4 and therefore an improvement of the thermal properties of the multi-layer material 1 is achieved by orientation of the nanofibers or nanotubes at least primarily in the direction of the thermal flux, for example by making the nanofibers or nanotubes ferromagnetic prior to their inclusion in the matrix, i.e. for example by being coated with nanoparticles made of a ferromagnetic material. During the manufacture of the multi-layer material 1, the nanofibers or nanotubes are then optimally oriented by means of an external magnetic field (Arrow H) so that these nanofibers or nanotubes are oriented perpendicular or at least approximately perpendicular to the surface sides of the substrate 2 and the adjoining metallization 3 in the bond layer 4. After hardening of the bond layer 4 the nanofibers or nanotubes are fixed in this orientation.

The application of the ferromagnetic material or of the nanoparticles made of this material to the nanofiber material or the nanofibers or nanotubes then takes place using a suitable polymer forming a surface adhesive layer, for example using polyaniline.

A further improvement of the thermal properties of the multi-layer material 1 can be achieved by compression of the bond layer 4 after hardening, for example by hipping (HIP process) or by treatment in a vacuum, in order to close any existing bubbles or cavities in the respective bond layer 4.

The invention was described above based on an exemplary embodiment. It goes without saying that numerous modifications and variations are possible without abandoning the underlying inventive idea upon which the invention is based.

In particular, the thermal conductive adhesive or the bond material can be used not only for the manufacture of multi-layer materials or substrates, but also generally for all applications in which an adhesive bond between two components with simultaneous optimum heat transfer is needed.

Due to the nanofiber material with a carbon base the bond material is also electrically conductive, so that it can also be used optimally as an electrically conductive adhesive, i.e.

wherever an adhesive electrical connection is desired or required, for example in the mounting of components on printed circuit boards, etc.

REFERENCE LIST 1 multi-layer material
2 substrate
2.1 base material
2.2 insulating layer
3 metallization
4 adhesive or bond layer
5 heating plate
6,7 measuring plate
8 test piece
9, 10 plate
11, 12 layer of thermal compound

What is claimed is:

1. A composite material usable for a printed circuit board comprising:
   a ceramic carrier substrate made of an electrically insulating material on at least one surface side of the carrier substrate; and
   at least one metal component bonded to the at least one surface side of the carrier substrate by an adhesive bond layer, wherein the adhesive bond layer comprises an adhesive nanofiber material having a length between 1 and 100 μm in a synthetic matrix, wherein the nanofiber material is coated with a ferromagnetic material and is oriented at least for the most part in an axis direction perpendicular to mutually adjoining surfaces.

2. The composite material according to claim 1, wherein the adhesive bond layer is made of the synthetic matrix with an epoxy base.

3. The composite material according to claim 1, wherein the nanofiber material is coated with a ferromagnetic material composed of $Fe_2O_3$.

4. The composite material according to claim 1, wherein the synthetic matrix is polyester.

5. The composite material according to claim 1, wherein the synthetic matrix contains 5-30 percent by weight nanofiber material in relation to the total weight.

6. The composite material according to claim 1, wherein carbon nanofibers are used as the nanofiber material.

7. The composite material according to claim 1, wherein the nanofiber material is pretreated at 3000° C. prior to being included in the synthetic matrix.

8. The composite material according to claim 1, wherein the nanofiber material is included in the synthetic matrix using a solvent comprised of triethylene glycol monobutylether.

9. The composite material according to claim 1, wherein the at least one metal component is made of copper.

10. The composite material according to claim 1, wherein the at least metal one component is applied to both sides of the carrier substrate by means of an adhesive bond layer.

11. The composite material according to claim 1, wherein the carrier substrate is made of an aluminum-oxide ceramic, aluminum-nitride ceramic or silicon-nitride ceramic.

12. The composite material according to claim 1, wherein the nanofiber material is chemically pre-treated at least on its surface.

13. The composite material according to claim 1, wherein the adhesive bond layer is compressed after hardening by hipping or by treatment in a vacuum.

14. The composite material according to claim 1, wherein the nanofiber material is a material with a carbon or synthetic base.

* * * * *